July 12, 1960 R. W. BRADMILLER 2,945,121
RADIO FREQUENCY TRANSISTOR RECEIVERS
PROVIDED WITH AUTOMATIC GAIN CONTROL
Filed March 21, 1956 2 Sheets-Sheet 1

INVENTOR.
RICHARD W. BRADMILLER
BY
Zugelter & Zugelter
Attys.

July 12, 1960 R. W. BRADMILLER 2,945,121

RADIO FREQUENCY TRANSISTOR RECEIVERS PROVIDED WITH AUTOMATIC GAIN CONTROL

Filed March 21, 1956 2 Sheets-Sheet 2

INVENTOR.
RICHARD W. BRADMILLER
BY Zugelter & Zugelter
Attys.

United States Patent Office 2,945,121
Patented July 12, 1960

2,945,121

RADIO FREQUENCY TRANSISTOR RECEIVERS PROVIDED WITH AUTOMATIC GAIN CONTROL

Richard W. Bradmiller, Springfield Township, Hamilton County, Ohio, assignor to Avco Manufacturing Corporation, Cincinnati, Ohio, a corporation of Delaware Filed Mar. 21, 1956, Ser. No. 572,882

1 Claim. (Cl. 250—20)

This invention relates to radio receivers and more particularly to receivers in which transistors are employed.

Transistors as heretofore employed in radio receiver circuits were limited in input signal capacity, 10,000 micro volts being about the practical limit. In conventional receivers the audio stage and preceding stages are overloaded, thus rendering them substantially inoperative to receive input signals in excess of 10,000 micro volts at the input terminals of a transistorized receiver.

An object of this invention is to provide a radio receiver which utilizes transistors in the various stages, with means for greatly increasing the magnitude of the input signals that can be handled by the receiver without overloading the audio stage or preceding stages of the circuit.

Another object of the invention is to provide a transistor radio receiver with means for so automatically regulating the impedance of the radio frequency tuned input circuit that overloading of succeeding stages is avoided.

A further object is to provide a radio frequency transistor receiver of the type set forth in the next preceding object, with a diode in the tuned input circuit that operates to decrease the impedance of that circuit when the radio frequency signal input voltage reaches a predetermined level of say 3,000 micro volts, the reduction in the impedance being substantially linear with the increase in the input signal above that predetermined level.

A still further object of the invention is to provide a receiver as set forth in the next preceding object with a diode so connected to the tuned radio frequency input circuit that a transistor receiver can be operated over a much wider range of input signals than has been possible heretofore.

In a transistor receiver there is normally no control over the receiver input terminals in regard to the incoming signal. It is therefore an object of the invention to provide means for imposing amplitude control of the signal which is transmitted from the receiver input terminals to the transistor input terminals.

A further object is to provide in a high impedance circuit a diode shunting means controlled automatically by a bias voltage for decreasing the impedance in response to a condition in which the net bias on the diode changes from a non-conduction potential and polarity to a conduction potential and polarity.

The foregoing and other objects of the invention will be apparent to those of ordinary skill in the art to which the invention pertains from the following description and the drawings.

Figures 1, 2:
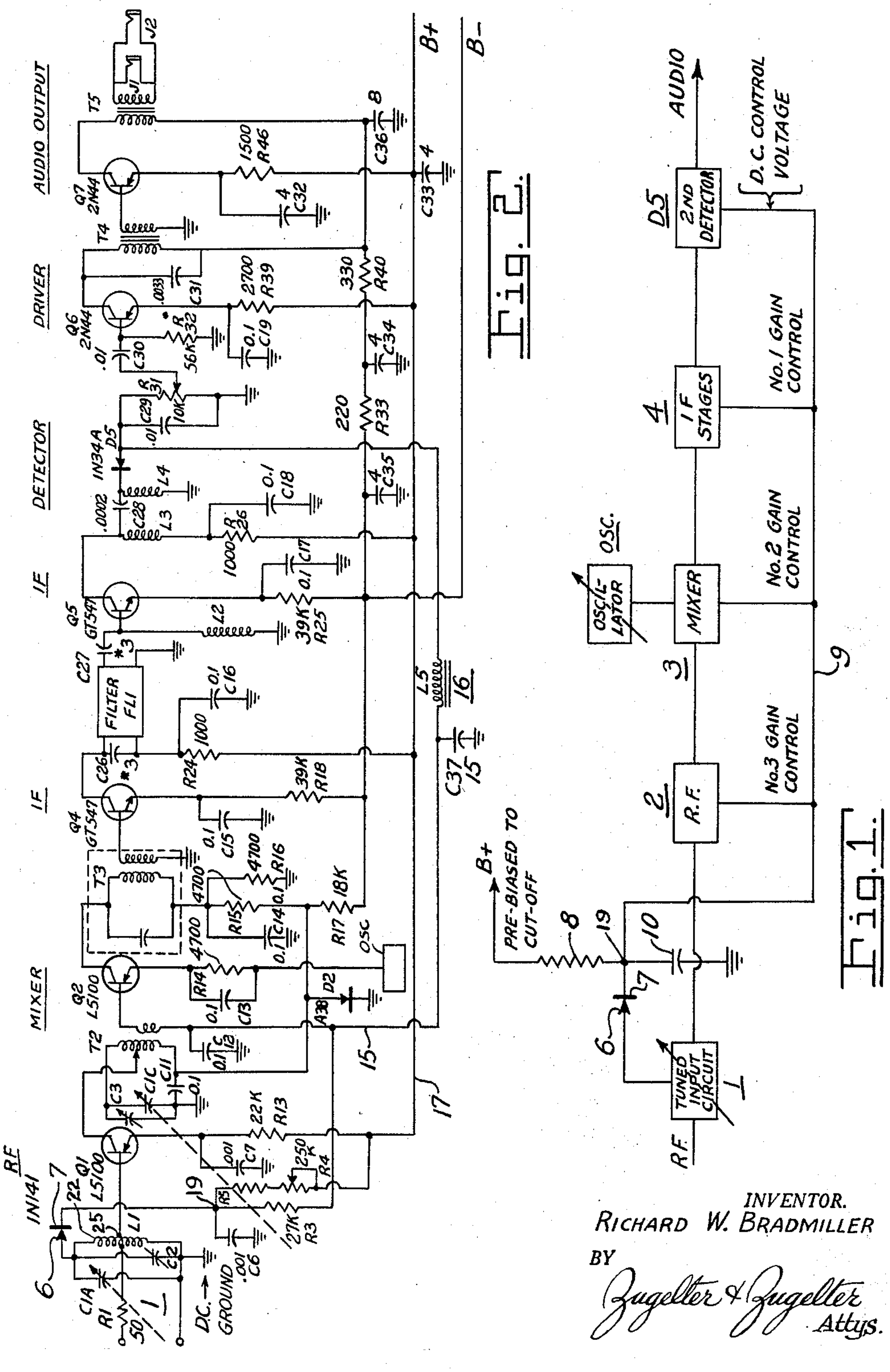
Figure 1 is a more or less diagrammatic view of a transistor radio frequency A.M. receiver arranged and constructed in accordance with an embodiment of the invention.
Fig. 2 is a view of a transistor radio frequency A.M. receiver circuit illustrating a practical adaptation of the invention.

In Fig. 1 of the drawings is illustrated a radio frequency A.M. receiver circuit of the transistor type provided with an automatic gain control arranged in accordance with an embodiment of the invention. The circuit includes a radio frequency tuned input circuit 1, a radio frequency amplifier stage 2, a mixer 3 to which the voltage of an oscillator OSC and the voltage of stage 2 at radio frequency are supplied. The output voltage of the mixer at a frequency of say 450 to 460 kilocycles is supplied to one or more cascaded intermediate frequency amplifier stages 4. The output of stage 4 is supplied to a detector D5 of the diode type and its output is supplied to an audio amplifier circuit as indicated.

D.C. voltage control is supplied to each of the various stages above mentioned to provide a plurality of cooperative gain control effects as indicated by the legends in Fig. 1.

The transistor receiver thus far described is well known. Transistor receivers, as heretofore constructed, have been limited to relatively low maximum input signal levels and when that maximum signal is exceeded, the gain at the various stages between the input and the audio stage would be so high as to overload them. Overloading usually incapacitates the receiver in that the intelligence at the audio is distorted or rendered unintelligible. Usually the maximum level of input signal is of the order of 10,000 microvolts. With reference to Fig. 1, the last intermediate stage is usually the stage which is overloaded first.

In accordance with this invention, it is possible to increase the input signal range many times over the range of prior art transistor receiver circuits without overloading the circuit at any stage. This is accomplished by employing a diode 6, 7 in such a way that after the signal level reaches a predetermined relatively low level, the impedance of the input circuit is reduced substantially linearly with the increase in the signal above that level. Thus, it is possible to provide a radio frequency transistor receiver that will be operative at input signal levels of the order of 100 times the level that can be tolerated by known transistor receiver circuits.

The anode terminal 6 of diode 6, 7 is connected to the tuned input circuit, and the cathode terminal 7 is connected to the +B voltage supply through a resistor 8 and to the D.C. control voltage bus 9. The cathode 7 of the diode 6, 7 is A.C. grounded or R.F. bypassed by a condenser 10. Diode 6, 7 may be of the 1N141 type. Its characteristics are such that with a given D.C. bias imposed on it, it will not pass current to ground through the condenser 10 until the input signal reaches a predetermined level of the order of 3000 microvolts, for example. At that level of input, the D.C. control voltage from the detector diode D5 overcomes the bias on diode 6, 7 whereupon it passes current to ground through the condenser 10. The effect of diode 6, 7 becoming conductive is analogous to that which would obtain if the impedance of the input circuit were reduced. Therefore, as the input signal increases to higher and higher values the impedance of the tuned input circuit is correspondingly reduced. Thus the mixer and the succeeding stages will not be overloaded even through the input signal strength increases to values far in excess of the signal strength that would normally produce overloading in the transistor receiver circuit as heretofore used. The transistor receiver is therefore made a more useful instrument because of its greatly increased signal receiving and signal utilizing capacity.

In Fig. 2 a practical application of the automatic gain control to a commercial transistor receiver circuit is shown. As the legends indicate, the circuit includes a tuned radio frequency input circuit RF, a Mixer, intermediate frequency stages (IF) between which is a filter FL1, a diode detector D5, a Driver stage and an audio output.

The radio frequency tuned input circuit 1 comprises a resistor R1, a variable condenser C1A, a variable condenser C2 and an inductance L1, the resistor R1 being connected in circuit at an appropriate tap point on the inductance L1. The inductance L1 is connected to the base plate of a transistor Q1 of the L5100 type. The output of the transistor Q1 is supplied to a transformer T2, the output of which is supplied to the Mixer. The mixer includes a transistor Q2 of the L5100 type and a transformer T3 having connected across its input terminals a condenser having a capacity of 120 micromicrofarads. The transistor Q2 is also supplied with an input voltage by the oscillator OSC. The output of the Mixer, as it appears at the transformer T3, is supplied to a transistor Q4 of the GT547 type, and the output of that transistor is supplied to a filter FL1 and thence to a transistor Q5 of the GT547 type.

The transistors Q4 and Q5 operate at intermediate frequencies as indicated. The output of the Q5 transistor is impressed on detector diode D5 of the IN34A type, and its output is supplied to a transistor Q6 of the 2N44 type which is embodied in the Driver stage. The transistor Q6 supplies a transformer T4 which, in turn, supplies an audio output stage in which is a transistor Q7 of the 2N44 type. The output of the Q7 transistor is supplied to a transformer T5, and audio output signals are available at outlets J1 and J2.

The circuit of Fig. 2 includes resistors and condensers and impedance coils as shown. The ohmic values of the various resistors are indicated; the capacities of the condensers are indicated in microfarads. Thus, for example, the resistor 46 in the circuit of the Q7 transistor has a value of 1500 ohms, and the condenser C32 associated with that resistor has a capacity of 4 microfarads. Similarly, resistor R39 has a value of 2700 ohms and the condenser C19 associated with that resistor has a capacity of 0.1 microfarads. The resistor R32 associated with the transistor Q6 has a value of 56,000 ohms, which is represented by the symbol 56K. The condenser C28 ahead of the detector diode D5 has a capacity of 0.0002 microfarads.

The impedance control diode 6, 7, as shown, is connected to the circuit comprising the inductance L1 and the condensers C1A and C2. The other terminal of diode D1 (diode 5 of Fig. 1) is grounded through a condenser C6 having a capacity of 0.001 microfarads. It is also connected through a resistor R3 having a value of 27,000 ohms to a conductor 15 that passes through an audio filter 16 to the output terminal of detector diode D5. Conductor 15 is also connected to the base terminal of transistor Q2. The diode 6, 7 (indicated also in Fig. 1) is biased to off condition by resistors R3, R4 and R5. The resistor R4 is connected by a conductor 17 to the +B voltage supply, as shown. The +B voltage is also supplied to the Q1 transistor, as shown. The diode 6, 7 passes current when the potential at the junction 19 with resistor R5 changes from plus to minus.

Overloading of the input terminals of transistors occurs at about 10,000 microvolts. The impedance control diode 6, 7 prevents overloading the input terminals of the transistors.

Assuming that the radio frequency input signal to the receiver is below say 3000 microvolts, then the voltage at junction 19 will be plus so that the impedance control diode 6, 7 does not pass current. As the signal level increases above say 3000 microvolts, the potential at junction 19 becomes negative, thereby removing the bias from diode 6, 7 and causing it to pass signal currents to ground through the condenser C6 (numbered 10 in Fig. 1) which has a capacity of about 0.001 microfarads. Since diode 6, 7 has been rendered conductive, the impedance of the radio frequency input circuit is decreased. Consequently, while the input signal is increasing, the actual signal impressed on the input terminals of the transistors of the amplifier RF, the mixer and the intermediate stages (IF) and the detector D5 is controlled to usable levels. However, the output at the audio stage remains substantially constant. Therefore, the input signal level may increase many times the value which could be handled by the circuit if the control action provided by the diode 6, 7 were not employed, without overloading the radio frequency stage which includes the transistor Q1, the mixer, the intermediate frequency stages IF, the detector D5 and the audio stage. Experimental work has shown that the receiver input signal may be as high as 2 or 3 volts and possibly as high as 5 volts, as distinguished from microvolts.

Figure 3:
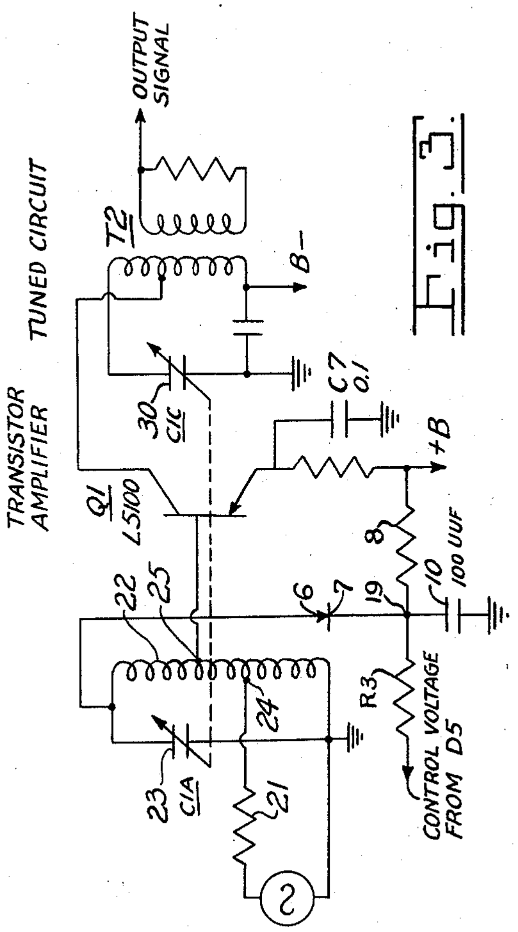
Fig. 3 is a detailed view of the tuned input circuit of the receiver of Fig. 2 and the diode which increases the range of automatic gain control.

Fig. 3 illustrates in greater detail a form of the automatic gain control features which has been illustrated in Figs. 1 and 2. The input circuit is shown as comprising a resistor 21, an inductance 22, and an adjustable condenser 23. The condenser and the inductance are connected to form a closed circuit, as shown. The input signal passes through resistor 21 to the inductance 22 at tap 24 and the base of the transistor Q1 is connected to a tap 25 of that inductance. Diode 6, 7 is connected between the junction of condenser 23 and inductance 22 and the junction of resistors R3 and 8, the latter having indicated values of 27,000 and the order of 250,000 ohms, respectively (resistor 8 in Figs. 1 and 3 being the equivalent of R5 and R4 in Fig. 2). The junction between the resistors R3 and 8 is connected through condenser 10 to ground. The transistor Q1 feeds transformer T2, having an adjustable condenser 30 is circuit therewith (it being the same condenser as shown at C1C in Fig. 2). Condensers 23 and 30 are ganged together so that they can be adjusted simultaneously with one actuator.

The output of the transistor Q1, as it appears at transformer T2, provides the input for the mixer described in connection with Fig. 2. So long as the voltage impressed by the +B terminal of Fig. 2 across resistor 8 and diode 6, 7 is such that the potential at the junction 19 between resistors R3 and 8 is of positive polarity, diode 6, 7 will not conduct. But as soon as the polarity of the junction and the cathode of the diode rectifies 6, 7 changes from plus to minus, diode 6, 7 conducts, and the extent to which it conducts depends primarily upon the voltage at the output of detector diode D5 (Fig. 2). As that voltage increases, the cathode of diode 6, 7 becomes less positive relative to the anode, and the conductance of diode 6, 7 increases in substantially a linear relation to the increase in output voltage of the detector diode D5. Consequently, the impedance of the input circuit is reduced accordingly. Therefore, the input signal to the input circuit may increase many times over that which the circuit could handle if it were not for the automatic gain control provided by the diode 6, 7.

This system (Fig. 2) provides negligible loss at low signal level; the action is delayed for signal levels up to 3000 microvolts, by means of the resistance R5 and R4 from the diode 6, 7 to the positive bias. The series resistance R3 to the AVC bus prevents the diode 6, 7 from drawing excessive power from the AVC source D5 and disrupting mixer AVC action. The capacitor C6 from the cathode of the diode 6, 7 to ground is sufficiently large to provide good RF bypass and sufficiently small to prevent detection of the AM signal and introduction of intermodulation effects.

Having thus described the invention, it will be apparent to those of ordinary skill in the art to which the invention pertains that the illustrated embodiments of the in-vention may be modified and changed without departing from either the spirit or the scope of the invention.

Therefore, what is claimed as new and desired to be secured by Letters Patent is:

In a radio receiver of the type having a signal translating stage provided with a high potential terminal and a low potential terminal connected to a point of reference potential, and at least one transistorized stage coupled in cascade to said signal translating stage, the combination of: an attenuating circuit comprising an attenuating diode and a radio frequency by-pass capacitor connected in series between said terminals, with the anode of said attenuating diode connected to said high potential terminal and in circuit with said point of reference potential, and said capacitor connected between the cathode of the attenuating diode and said point of reference potential; a source of biasing potential; a voltage divider comprising first, second, and third resistors connected across said source, the first resistor being connected between the positive terminal of said source and the cathode of said attenuating diode for applying to said attenuating diode a reverse bias which renders the attenuating diode nonconductive in the absence of input signals and in the presence of output signals below a predetermined magnitude; a detector stage comprising a detecting diode poled with its anode connected to the junction of the second and third resistors and its cathode in circuit with said point of reference potential, so that the third resistor portion of the voltage divider applies to the detector anode a forward bias, currents in the third resistor flowing by reason of the detection of input signals in excess of said predetermined magnitude developing across said third resistor an AGC potential which is applied to a transistorized stage and to the cathode of the attenuating diode to overcome the positive bias on the attenuating diode and render the attenuating diode conductive, currents in said attenuating diode developing across the first-mentioned resistor a supplemental automatic gain control potential which is also applied to said transistorized stage so that both diodes cause to be applied to said transistorized stage complementary gain control effects, thereby minimizing power drain from the detector.

References Cited in the file of this patent

UNITED STATES PATENTS

| | | |
|---|---|---|
| 2,012,433 | Myers | Aug. 27, 1935 |
| 2,024,139 | Armstrong | Dec. 17, 1935 |
| 2,088,210 | Koch | July 27, 1937 |
| 2,247,324 | Travis | June 24, 1941 |

FOREIGN PATENTS

| | | |
|---|---|---|
| 414,187 | Great Britain | Aug. 2, 1934 |

OTHER REFERENCES

Article, Electrical Engineering, March 1954, pages 1107–1112.

Article 2, "Radio and Television News," July 1955, page 50.